US011955364B2

(12) United States Patent
Wise et al.

(10) Patent No.: US 11,955,364 B2
(45) Date of Patent: Apr. 9, 2024

(54) TELESCOPING LINEAR EXTENSION ROBOT

(71) Applicant: Kimball Electronics Indiana, Inc., Jasper, IN (US)

(72) Inventors: Lawrence A. Wise, San Juan Capistrano, CA (US); Anthony J. Kilaita, Santa Clarita, CA (US)

(73) Assignee: Kimball Electronics Indiana, Inc., Jasper, IN (US)

( * ) Notice: Subject to any disclaimer, the term of this patent is extended or adjusted under 35 U.S.C. 154(b) by 0 days.

(21) Appl. No.: 17/570,942

(22) Filed: Jan. 7, 2022

(65) Prior Publication Data

US 2022/0238369 A1    Jul. 28, 2022

Related U.S. Application Data

(60) Provisional application No. 63/140,597, filed on Jan. 22, 2021.

(51) Int. Cl.
| | | |
|---|---|---|
| *H01L 21/687* | (2006.01) | |
| *B25J 11/00* | (2006.01) | |
| *B25J 15/00* | (2006.01) | |
| *B25J 18/02* | (2006.01) | |
| *H01L 21/67* | (2006.01) | |
| *B25J 13/08* | (2006.01) | |

(52) U.S. Cl.
CPC ..... *H01L 21/68707* (2013.01); *B25J 11/0095* (2013.01); *B25J 15/0004* (2013.01); *B25J 18/02* (2013.01); *H01L 21/67259* (2013.01); *B25J 13/088* (2013.01)

(58) Field of Classification Search
CPC ......... H01L 21/68707; H01L 21/67259; B25J 11/0095; B25J 15/0004; B25J 18/02; B25J 13/088
See application file for complete search history.

(56) References Cited

U.S. PATENT DOCUMENTS

| | | | |
|---|---|---|---|
| 11,077,466 B2* | 8/2021 | Bonora | ............ H01L 21/67772 |
| 2003/0156928 A1 | 8/2003 | Sackett et al. | |
| 2006/0245862 A1* | 11/2006 | Hansl | ...................... B66F 9/141 |
| | | | 414/281 |
| 2009/0136331 A1* | 5/2009 | Muser | ....................... B66F 9/07 |
| | | | 414/529 |

(Continued)

FOREIGN PATENT DOCUMENTS

| | | | | |
|---|---|---|---|---|
| CN | 102905996 A | | 1/2013 | |
| CN | 209522153 U | * | 10/2019 | ......... B25J 15/0233 |

(Continued)

*Primary Examiner* — Gerald McClain

(74) *Attorney, Agent, or Firm* — Faegre Drinker Biddle & Reath LLP

(57) ABSTRACT

A telescoping linear extension robot includes a base configured to support the telescoping linear extension robot, a first driven platform, drivingly coupled to the base, a second driven platform, drivingly coupled to the first driven platform, and a floating intermediate platform. The intermediate platform is configured to increase the extendable range of the driven extensions by facilitating additional extension using force generated by the driven platforms of the robot. This, in turn, allows for long-reach robot solutions with reduced physical footprint, complexity and cost.

19 Claims, 9 Drawing Sheets

(56) References Cited

U.S. PATENT DOCUMENTS

| | | | |
|---|---|---|---|
| 2015/0003945 A1 | 1/2015 | Takahashi et al. | |
| 2019/0048980 A1* | 2/2019 | Muser | B66F 9/141 |
| 2020/0206909 A1* | 7/2020 | Goncalves | B25J 9/023 |
| 2020/0206946 A1* | 7/2020 | Bondaryk | B25J 9/02 |

FOREIGN PATENT DOCUMENTS

| | | | |
|---|---|---|---|
| JP | 02-269591 A | 11/1990 | |
| JP | 2008-050072 A | 3/2008 | |
| KR | 10-2012-0007758 A | 1/2012 | |
| WO | WO-2004103883 A1 * | 12/2004 | B65G 1/0435 |
| WO | 2011/151004 A1 | 12/2011 | |
| WO | 2020/156393 A1 | 8/2020 | |
| WO | WO-2020156393 A1 * | 8/2020 | |

* cited by examiner

TELESCOPING LINEAR EXTENSION ROBOT

CROSS REFERENCE TO RELATED APPLICATION

This application claims the benefit of U.S. Provisional Application Ser. No. 63/140,597, filed Jan. 22, 2021 and entitled TELESCOPING LINEAR EXTENSION ROBOT, the entire disclosure of which is hereby expressly incorporated herein by reference.

BACKGROUND

1. Technical Field

The present application relates to telescoping linear extension robots for use in substrate delivery systems and, more particularly, to a telescoping linear extension robot with two driven extension stages and a floating intermediate stage to provide extended reach.

2. Description of the Related Art

The processing of semiconductors requires the movement of substrates across varying distances and locations. In some cases, such substrates can be heavy, such as several kilograms or more. In addition, the semiconductor industry is generally highly automated and may be optimized for large batch processing. Process tools utilizing these large, heavy substrates for batch wafer processing require high performance throughput, with competing interests of minimized cost and size for optimized production.

Due to the high output needs of semiconductor production, floor space in fabrication sites is valuable. The use of substrate transfer systems with multiple robots has resulted in tools that are too expensive and require large floor footprints for basic functionality.

Current solutions on the market includes usage of selective compliance assembly robot arms (SCARA) for linear movements, or basic linear extension drives. However, substrates often need to be transported across different distances based on production of different batches. Additionally, a wide range of substrate weights are needed for certain semiconductor productions. The currently available solutions on the market fail to account for the need for versatility, cost effectiveness, and floor footprint awareness.

What is needed is an improvement over the foregoing.

SUMMARY

The present disclosure is directed to a telescoping linear extension robot which includes a base configured to support the telescoping linear extension robot, a first driven platform, drivingly coupled to the base, a second driven platform, drivingly coupled to the first driven platform, and a floating intermediate platform. The intermediate platform is configured to increase the extendable range of the driven extensions by facilitating additional extension using force generated by the driven platforms of the robot. This, in turn, allows for long-reach robot solutions with reduced physical footprint, complexity and cost.

In one form thereof, the present disclosure provides a telescoping linear extension robot including a base platform; a first driven platform; an intermediate platform deployed between the base platform and the first driven platform and a first motor operably coupled to the first driven platform and the base platform. The intermediate platform is slideably coupled to the base platform and configured to move along a first path relative to the base platform, and the first driven platform is slideably coupled to the intermediate platform and configured to move along a second path relative to the intermediate platform, the first path defining an extension of the second path. Activation of the first motor drives the first driven platform along the second path, and the first motor is decoupled from the intermediate platform such that the intermediate platform is allowed to move independently of the first motor along the first path, whereby the intermediate platform is configured to non-drivingly increase an extendable range of the telescoping linear extension robot.

In another form thereof, the present disclosure provides a method of delivering a substrate for use in semiconductor processing using a telescoping linear extension robot, the method including placing substrate on a substrate base of the telescoping linear extension robot, extending a first driven platform a first distance via a direct coupling with a first motor, extending the first driven platform a second distance beyond the first distance by actuating an intermediate platform via an indirect coupling with the first motor, and extending a second driven platform a third distance beyond the second distance via a direct coupling with a second motor, the second driven platform including the substrate base.

Additional features and advantages of the present invention will become apparent to those skilled in the art upon consideration of the following detailed description of an illustrative embodiment exemplifying the invention.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. Although the exemplifications set out herein illustrate embodiments of the invention, the embodiments disclosed below are not intended to be exhaustive or to be construed as limiting the scope of the invention to the precise form disclosed.

DETAILED DESCRIPTION

Figure 1:
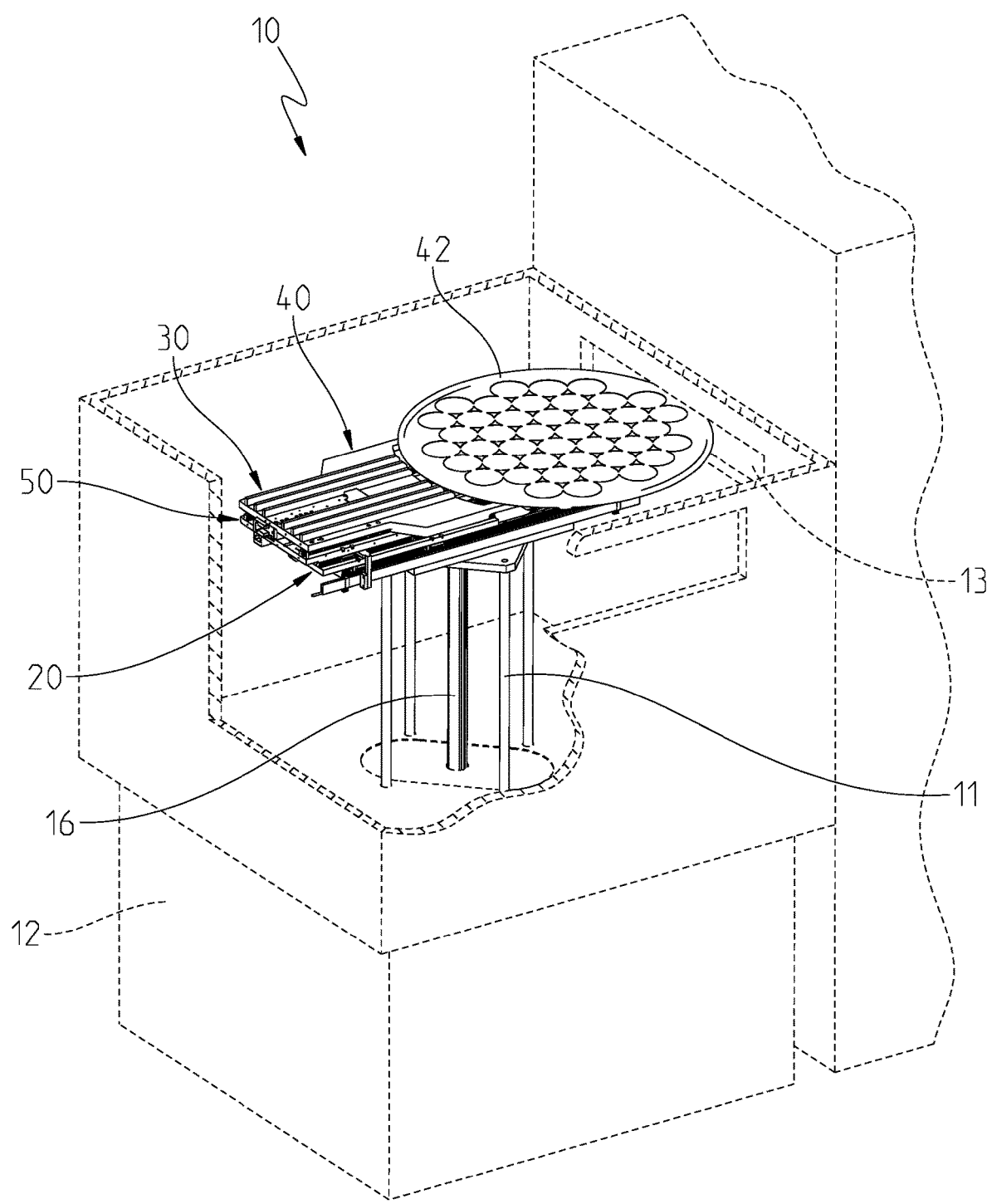
FIG. 1 is a top perspective view of a telescoping linear extension robot made in accordance with the present disclosure, shown in a retracted configuration.

For the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. One embodiment of the invention is shown in great detail, although it will be apparent to those skilled in the relevant art that some features that are not relevant to the present invention may not be shown for the sake of clarity.

The present disclosure is directed to a telescoping linear extension robot 10, shown in FIG. 1, designed for transport of relatively large, heavy substrates, such as substrates weighing over 5 kg and up to 17 kg, over a distance approaching multiples of the diameter of the substrate, such as a reach of up to 1.5 meters, while maintaining a compact footprint when retracted. Additionally, robot 10 depicted in FIG. 1 provides minimum vertical deflection in use, and utilizes a relatively narrow cross-section which aids in its employment to deliver substrates through housing slots 13, as further described below.

Figure 2:
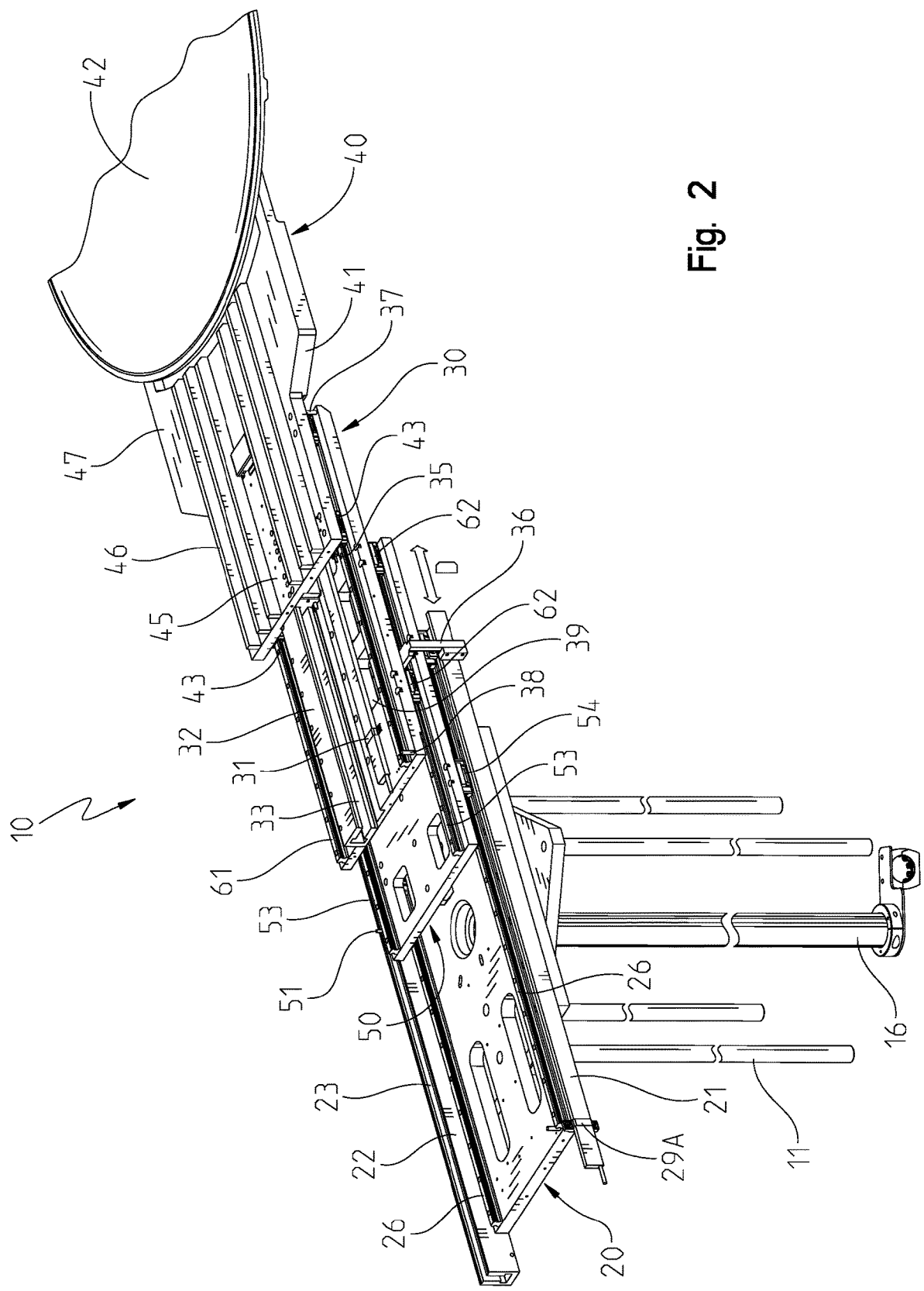
FIG. 2 is a top perspective view of the telescoping linear extension robot of FIG. 1, shown in an extended configuration.

As shown in FIG. 2 and further described herein, telescoping linear extension robot 10 includes two driven extension platforms, illustrated as second platform 30 and third platform 40, which serve as two powered extension stages. An additional undriven, or floating, extension stage member is shown as intermediate platform 50, which is configured to be pushed or pulled by the momentum of second platform 30, as further described below. The result is the ability to achieve an extended reach of a triple-stage extension, using only two drives and without any direct driving of one of the stages.

In the illustrated embodiment, the two driven stages are coupled to a controller that is programmed to achieve smooth extension and retraction moves, including through synchronization of the movement of each drive. The nature of the present "floating" mechanical coupling between the driven and floating stages cooperates with such synchronization to achieve move trajectories that are not limited to simple multiples of the base drive trajectory, as is typically the case where one drive moves two stages through a direct or "fixed" mechanical coupling. e.g., a gearing or pulley system. The present arrangement therefore provides superior acceleration and jerk control to facilitate the smooth, precise movement of large-diameter heavy substrates while minimizing the size, complexity and cost of the overall system.

Turning again to FIG. 1, telescoping linear extension robot 10 is illustrated in a retracted configuration and in a schematically-illustrated working environment, which includes a housing 12. Housing 12 includes slot 13, through which telescoping linear extension robot 10 is configured to extend. FIG. 1 also demonstrates how the structural components of telescoping extension robot 10, when retracted, make up a compact mechanism footprint which fits within a relatively small enclosed space provided by housing 12, but also provides sufficient reach to extend substantially through slot 13 to fully reposition a substrate positioned on base 42.

In the illustrated embodiment, stand 11 includes a plurality of legs or guides (e.g., four) which support and guide robot 10 above a ground or lower support surface, and drive shaft 16 extending upwardly within the footprint of stand 11 to drive rotation and vertical adjustment, or lift, of robot 10, as further described below.

In some working environments, robot 10 may be required to extend through one slot 13 of housing 12 to receive a substrate, retract, rotate to an orientation aligned with another slot 13, and extend through this slot 13 to deliver the substrate to its next destination in the process. Robot 10 may also raise or lower the substrate, as needed, to vertically alight with the desired slot 13. In this way, robot 10 may be used to facilitate the transfer of substrates from one part of a production line to another.

FIG. 2 illustrates telescoping linear extension robot 10 in an extended configuration. Telescoping linear extension robot 10 includes a first, fixed lower platform 20 mounted (i.e., fixed) on stand 11, a second, intermediate driven platform 30 which is drivingly coupled to first platform 20, and a third, upper driven platform 40 which is drivingly coupled to second platform 30. A fourth, intermediate floating platform 50 is slidably coupled to, and disposed between, the fixed lower platform 20 and the second, intermediate driven platform 30.

The mechanisms and parts of each individual component of telescoping extension robot 10 will be discussed in detail below. The illustrative arrangement of platforms 20, 30, 40 and 50 shown in FIG. 2 will be described herein for purposes of illustrating the invention, but it is contemplated that other arrangements may be made in which the floating platform occupies a different position in the height order (e.g., between the two driven platforms, for example), and that other modifications may be made as desired or required for a particular application (e.g., platforms having alternative orientations relative to gravity and one another).

Stand 11 includes an upper platform portion supported by at least three (as illustrated in FIGS. 1 and 2, four) guides which are long enough to vertically guide telescoping linear extension robot 10 to a desired height, which may be determined by the configuration of housing 12 and slot 13. Stand 11 is configured to support the weight of telescoping extension robot 10 and a heavy substrate supported by base 42 and moved by telescoping extension robot 10. Furthermore, stand 11 is configured withstand the dynamic forces and weight distribution changes associated with transport of the heavy substrate supported by base 42 between a retracted configuration (FIG. 1) and an extended configuration (FIG. 2) of the telescoping extension robot 10, as well as the forces arising from acceleration during the transition between such configurations.

Figure 4:
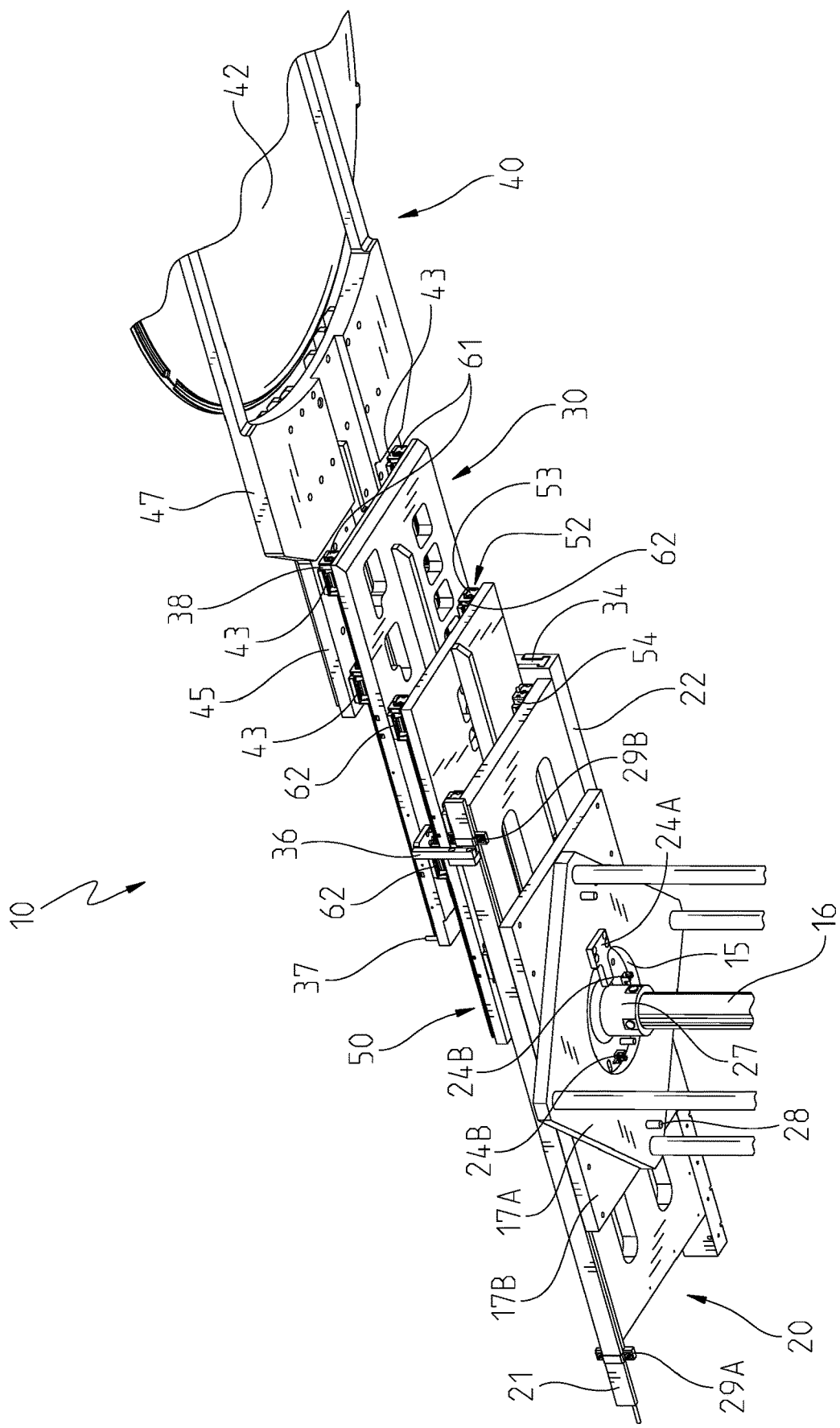
FIG. 4 is a bottom perspective view of the telescoping linear extension robot of FIG. 1, shown in an extended configuration.
Figure 5:
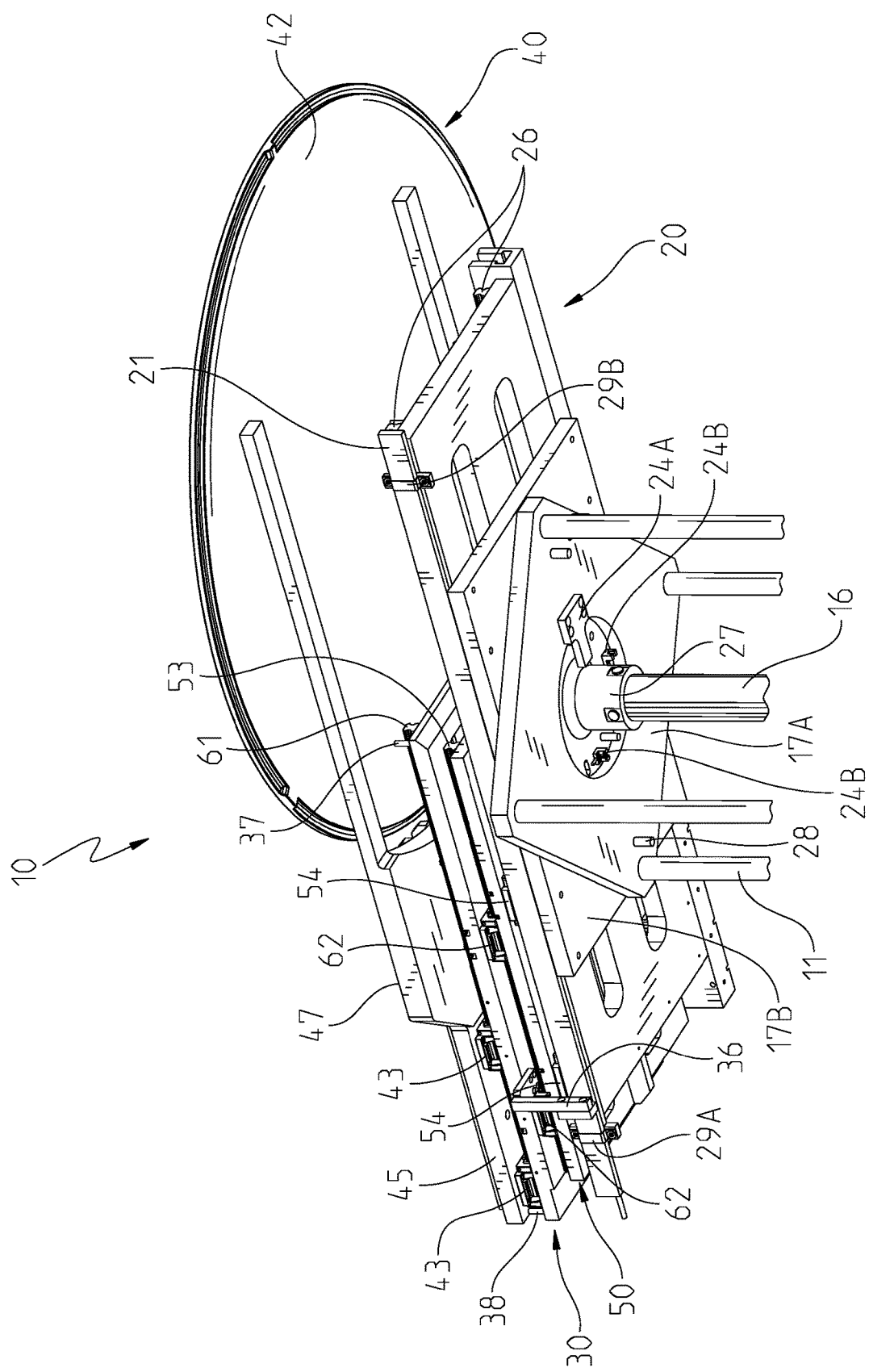
FIG. 5 is a bottom perspective view of the telescoping linear extension robot of FIG. 1, shown in a retracted configuration.

As shown in FIGS. 4 and 5, the upper platform 17B of stand 11 includes fastener apertures which allow fasteners to mount and fix telescoping extension robot 10 to stand 11. Lower platforms 17A of stand 11 include a large central aperture 15 (FIG. 4), into which drive shaft 16 extends. An upper axial end of drive shaft 16 is sized and configured to be received within and coupled to mounting collar 27, which is fixed (e.g., welded) to upper platform 17B and extends from a bottom side thereof. Upper platform 17B is rotatably supported atop lower platform 17A of stand 11, optionally with a lubricious disc or bearing therebetween to facilitate rotation. Upper platform 17B is fixed (e.g., by threaded fasteners) to a bottom surface of first platform 20 of robot 10, such that rotation of drive shaft 16 causes a corresponding rotation of upper platform 17B and robot 10. This rotation allows robot 10 to pivot for alignment with different slots 13 (FIG. 1), as described herein.

Robot 10 includes an array of sensors, such as through-beam sensors capable of sensing distances of 3 mm or more to sense movements of platforms 30, 40 and/or 50, and issuing a signal to a controller indicative of such movements as further described below. Additionally, the sensors may include rotational sensor 24A (FIG. 4) configured to register the presence and proximity of devices 24B, which are placed at particular rotational positions on the rotatable upper platform 17B of stand 11. In this way, sensor 24A cooperates with devices 24B to monitor rotational position and movement of robot 10 and issue signals indicative of such movement to the controller. The controller may be configured to send and receive information to and from the user and robot 10, such as by receiving both positional and rotational sensor information, and issuance of commands to rotate, raise/lower and extend/retract robot 10.

Figure 3:
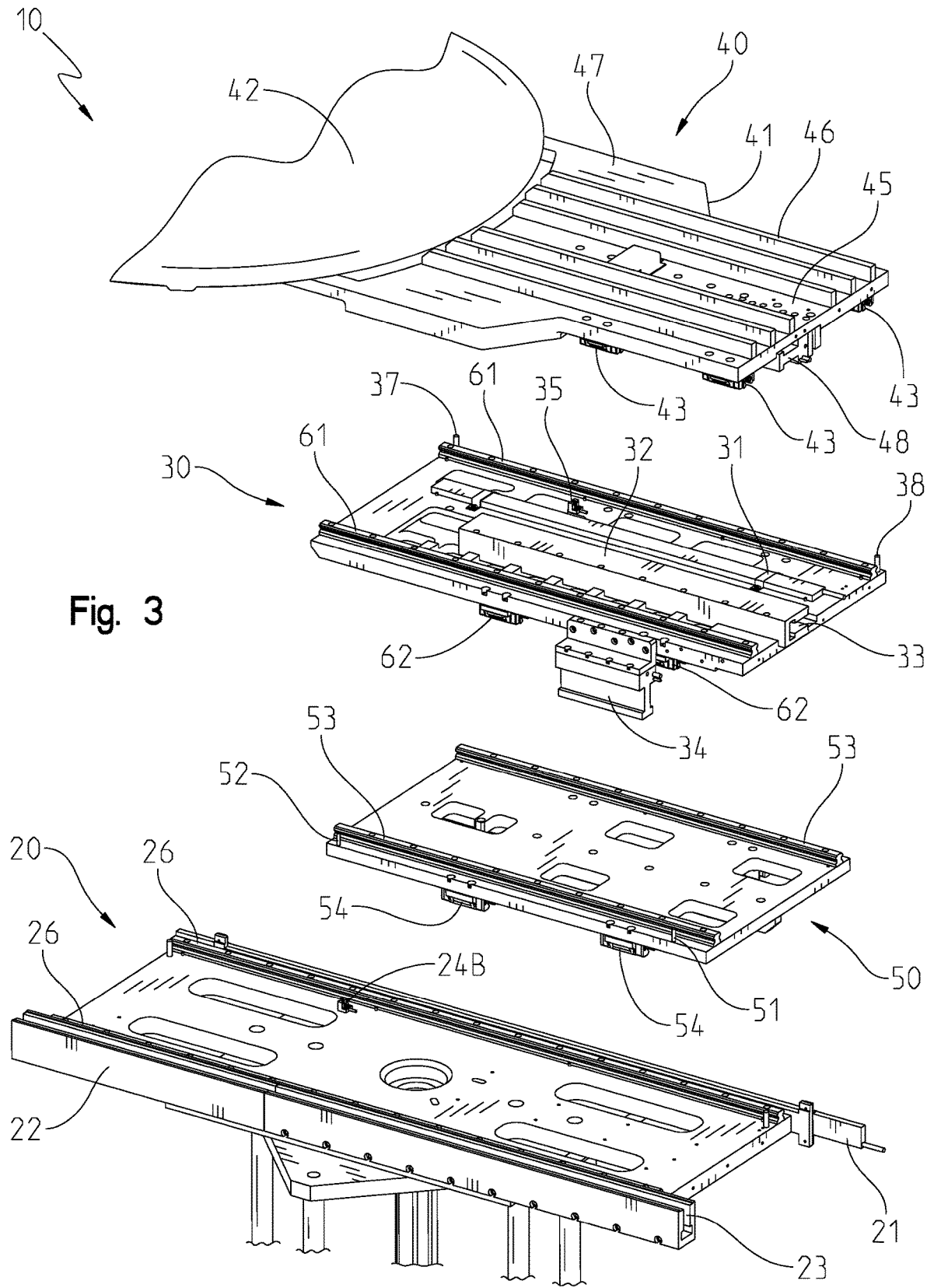
FIG. 3 is an exploded, rear perspective view of the linear extension robot shown in FIG. 1.

As illustrated in FIGS. 4 and 5, first platform 20 is rectangular in shape and is configured to rest atop and to be slidably coupled to upper platform 17B. As illustrated in FIG. 3, first platform 20 includes encoder bar 21, motor 22 including motor track 23 and slider 34, sensor assembly 24A/24B, and rails 26.

Encoder bar 21 extends along the length of one of the long sides of first platform 20, including end portions extending past the ends of this long side. Encoder bar 21 is coupled to the outer edge of this long side of first platform 20 by retainer bracket 29A, 29B. Encoder bar 21 cooperates with encoder sensor 36, connected to intermediate platform 30, to detect and monitor the linear position of intermediate platform 30 relative to fixed platform 20, and sensor 36 issues a signal indicative of its position along encoder bar 21 which corresponds to a particular position of intermediate platform 30.

Motor 22 is positioned along the opposite long side of first platform 20 and is coupled to its corresponding outer edge. In the embodiment of FIGS. 1-9, motor 22 is a linear magnetic motor, but other types of motors may be used as required or desired for a particular application, such as various AC, DC, servo, or stepper motors. Motor 22 includes motor track 23, which a slot formed in motor 22 which is shaped and configured to slidably receive, retain and drive slider 34 along track 33 upon activation of motor 22.

As best illustrated in FIG. 2, the fixed first platform 20 includes two rails 26 configured to constrain the motion of floating platform 50 along a linear path relative to base platform 20. Non-linear paths may also be employed by utilizing curved rails, as required or desired for a particular application. In the illustrated embodiment, rails 26 extend along the length of both long sides of first platform 20, inside of encoder bar 21 and motor 22. Rails 26 are configured to slidably receive and retain carriages 54 fixed to intermediate platform 50. Rails 26 are configured to define the extension path for intermediate platform 50 to translate along during extension and retraction of telescoping linear extension robot 10.

As best shown in FIG. 3, first platform 20 also includes a sensor device 24B fixed to its upper face inward of encoder bar 21 and linear movement rail 26. A sensor 24A, not shown in FIG. 3 but also illustrated and described with respect to FIG. 4, is also fixed to an under surface of intermediate platform 50, and is configured to register the proximity of sensor device 24B when robot 10 is in its extended configuration (FIG. 2), such that sensor 24A issues a signal to the controller indicative of the extended configuration. The controller may prevent any further activation of motor 22 when such signal is received, thereby preventing over-extension of robot 10. Additionally, the illustrated position and configuration ensures of sensor 24A and sensor device 24B are protected from damage and contamination during operation and service of robot 10.

As illustrated in FIGS. 2 and 3, motor 22 is long enough to drive second, intermediate driven platform 30 beyond what would normally be considered an acceptable distance along fixed platform 20. However, because floating platform 50 is disposed and deployed between intermediate driven platform 30 and fixed platform 20 and provides additional mechanical support to intermediate platform 30, the maximum acceptable distance of extension is increased by distance D. More particularly, the acceptable extension distance of intermediate driven platform 30 is a function of minimum overlap between the platforms when fully extended, which in turn is dictated by the support, rigidity and deflection needed to support a given amount of weight. For any given minimum overlap, the acceptable extension becomes longer with the addition of floating platform 50 because two sections of overlap are provided for a single motor 22.

Second platform 30 also includes carriages 62 configured to be retained upon, and slide over, rails 53 fixed to floating platform 50. Rails 53 are substantially parallel to rails 26 (e.g., defining an angle less than 0.5 degrees), such that second platform 30 slides along a linear path relative to intermediate platform 50 that is substantially parallel to the linear path of intermediate platform 50 described above. In addition, the path of second platform 30 forms an extension of the path defined by intermediate platform 50, such that the two paths cooperate to create a long extension path commensurate with the stroke of motor 22, while maintaining a small footprint as further described herein. As with the path defined by rails 26, the path defined by rails 53 may also be non-linear.

Carriages 62 are linear bearings which are configured to accommodate linear movement with little friction and resistance, similar to carriages 54 described above. In the illustrated embodiment, a pair of carriages 62 are positioned along each long side of third platform 40 at the front and rear, and are configured to be slidably retained on rails 53 of intermediate platform 50.

As depicted in FIG. 3, second platform 30 of robot 10 also functions as the base for second driven extension stage. While second platform 30 is configured to be supported by intermediate platform 50, second platform 30 similarly supports third platform 40. To this end, the illustrated embodiment of second platform 30 includes encoder bar 31, motor 32 having a motor track 33 and slider 48, another position sensor 35A/35B, stop pins 37 and 38, and linear rails 61.

Referring still to FIG. 3, encoder bar 31 of second platform 30 extends partially along the length of a top surface of second platform 30. Encoder bar 31 cooperates with an encoder sensor 31A, shown in FIG. 9, disposed on a bottom surface of third platform 40. Encoder sensor 31A may be configured the same as encoder sensor 36 described above, such that encoder sensor 31A cooperates with encoder bar 31 to generate and transmit signals indicative of the linear position of third platform 40 relative to second platform 30. In particular, encoder sensor 36 issues a signal indicative of its position along encoder bar 31 to the controller, and this signal corresponds to a particular position of third platform 40.

The controller may use this positional signal to selectively activate motor 32, which is disposed next to encoder bar 31. Motor 32 and encoder bar 31 run parallel to each other along the length of second platform 30. Similar to motor 22 described above, motor 32 is a linear magnetic motor, but, other types of motors may also be used such as various AC, DC, servo, or stepper motors. Motor 32 includes motor track 33 shaped and configured to slidably receive, retain and drive linear motion of a correspondingly shaped slider 48 (FIG. 9), such that activation of motor 32 causes movement of slider 48 through motor track 33, thereby moving intermediate platform 30 under the driving force of motor 32.

Turning again to FIG. 2, second platform 30 further comprises two rails 61 fixed to its upper surface, which are configured to cooperate with carriages 43 fixed to third platform 40 to define the linear motion of third platform 40. Rails 61 are substantially parallel to rails 53 and 26 (e.g., defining an angle less than 0.5 degrees), such that third platform 40 slides along a linear path relative to second platform 30 that is substantially parallel to the linear paths of intermediate platform 50 and second platform 30 described above. Rails 61 extend along the length of each long sides of second platform 30, and are configured to slidably receive and retain carriages 49 fixed to third platform 40. Rails 61 define the linear path for third platform 40 relative to second platform 30 during extension and retraction of telescoping linear extension robot 10. The path of third platform 40 can form a further extension of the paths of platforms 30 and 50, as shown in the FIGS. 2, 4 and 6. As with the paths defined by rails 26 and rails 53, the path defined by rails 61 may also be non-linear.

Figure 9:
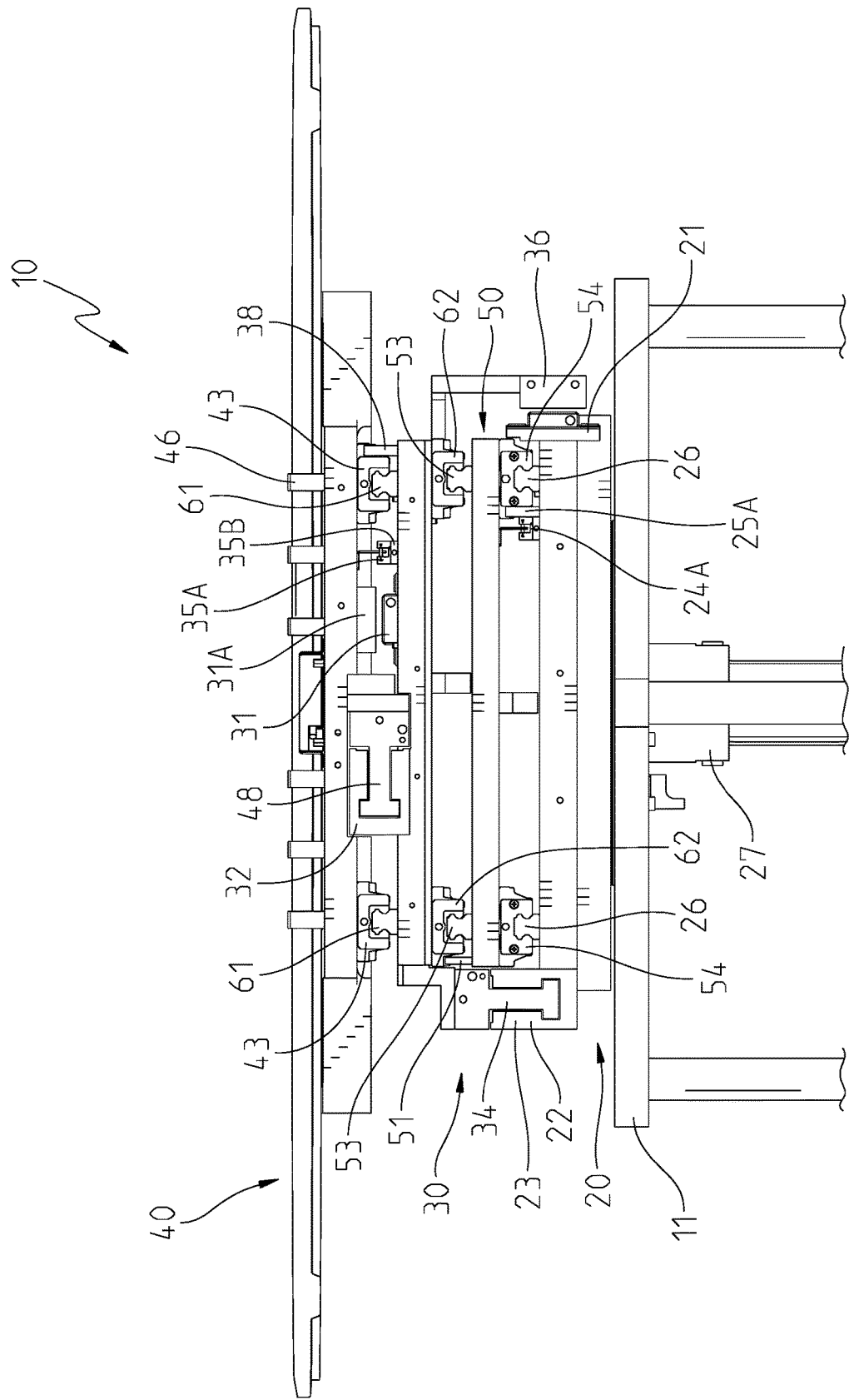
FIG. 9 is a rear elevation view of the telescoping linear extension robot, in a retracted configuration.

As best shown in FIGS. 3 and 9, second platform 30 also includes sensor 35A and sensor device 35B (FIG. 9), which may the same as sensor 24A and sensor device 24B shown and described above with reference to other components. Sensor 35A is disposed on an upper face of second platform 30 and laterally between encoder bar 31 and rail 61. Sensor device 35B and sensor 35A are also disposed underneath third platform 40 throughout the entire range of extension of telescoping linear extension robot 10. This position and configuration ensures that sensor device 35B and sensor 35A are protected from damage and contamination during operation and service of robot 10. Similar to sensor device 24B shown in FIG. 3 and described above with reference to fixed platform 20, sensor 35A is configured to register the proximity of sensor device 35B when robot 10 is in its extended configuration (FIG. 2), such that sensor 35A issues a signal to the controller indicative of the extended configuration. The controller may prevent any further activation of motor 32 when such signal is received, thereby preventing over-extension of robot 10.

Figure 8:
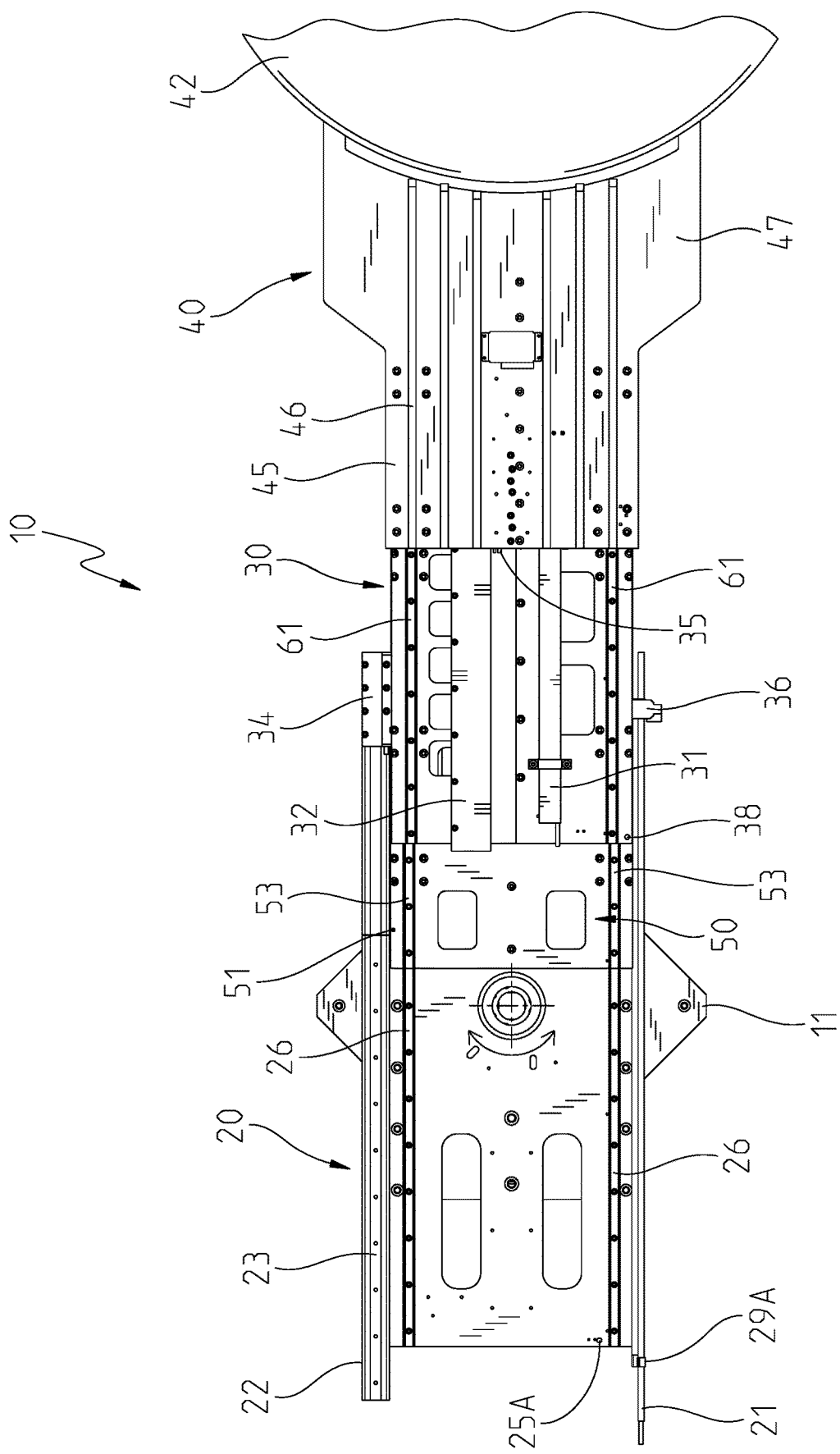
FIG. 8 is a top plan view of the telescoping linear extension robot of FIG. 1, shown in an extended configuration.

Second platform 30 also includes stop pin 37 and stop pin 38. Stop pin 37 extends vertically up from a corner of the leading edge of second platform 30. Stop pin 37 extends only partially the distance between second platform 30 and third platform 40, such that stop pin 37 does not touch third platform 40 during motion. As best shown in FIG. 8, stop pin 37 is configured to interact with the adjacent carriage 43 of third platform to pose a physical barrier to further extension of third platform 40 when it is fully extended. Stop pin 38 extends from a corner of a rear edge of second platform 30 having a similar profile to stop pin 37. Stop pin 38 is configured to interact with the adjacent carriage 43 of third platform 40 to pose a physical barrier to further retraction of third platform 40 when it is fully retracted.

As illustrated in FIG. 3, the end effector of telescoping linear extension robot 10 is part of third platform 40. Third platform 40 includes a first, rear portion 45 extending from its rear terminal edge forward to a second, middle portion 47. Middle portion includes widened frame 41, which provides structural support to substrate base 42 which is the front portion of third platform 40. In the illustrated embodiment, substrate base 42 is a circular construct which has a circumference sized to support large, heavy substrates for use in the semiconductor industry for the batch processing of device wafers.

As illustrated in FIG. 3, third platform 40 also includes ribs 46 which extend along the length of first portion 45 and second portion 47. Ribs 46 extend perpendicularly up from third platform 40 are configured to increase the strength and rigidity of third platform 40 to support the weight of heavy substrates and to reduce vibrations of third platform 40 during translation of telescoping linear extension robot 10. Ribs 46 also decrease deflection in third platform 40 while fully extended.

Referring still to FIG. 3, intermediate platform 50 includes extension pin 51 and retraction pin 52. As noted above, intermediate platform 50 is configured to slide along, or "float between", both first platform 20 and second platform 30 as described above, and pins 51, 52 provide some control over the time and circumstances of movement of intermediate platform.

In particular, extension pin 51 is positioned to be impacted by the leading or forward carriage 62 of second platform 30 during extension. Extension pin 51 is impacted by carriage 62 at a point in the translation of second platform 30 at which second platform 30 is still being driven to extend by motor 22. Second platform 30 continues to extend towards the extended configuration of FIG. 6 and "drags" intermediate platform forward along by the contact between extension pin 51 and the adjacent the forward carriage 62.

Figure 6:
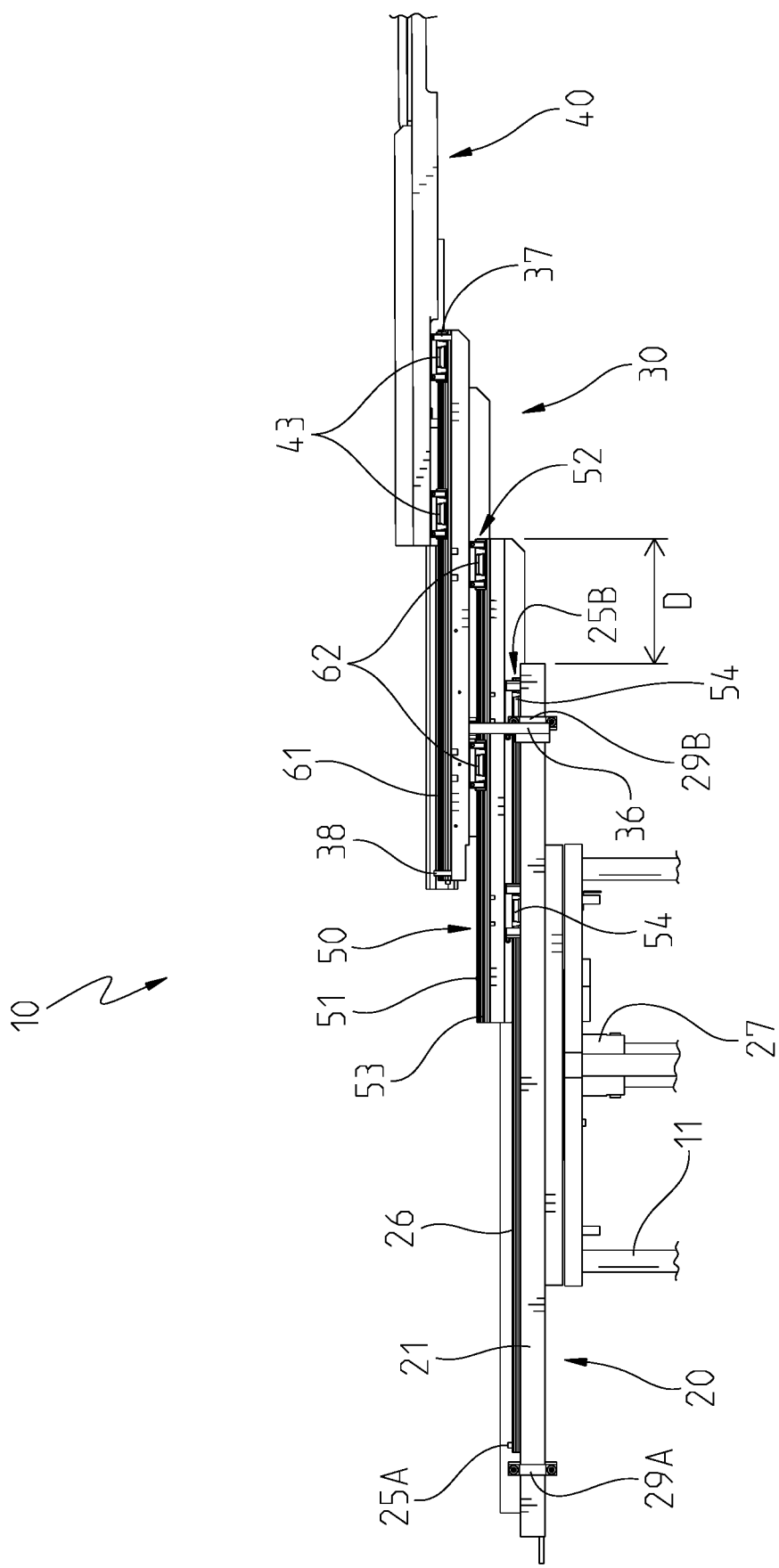
FIG. 6 is a left side elevation view of the telescoping linear extension robot of FIG. 1, shown in an extended configuration.
Figure 7:
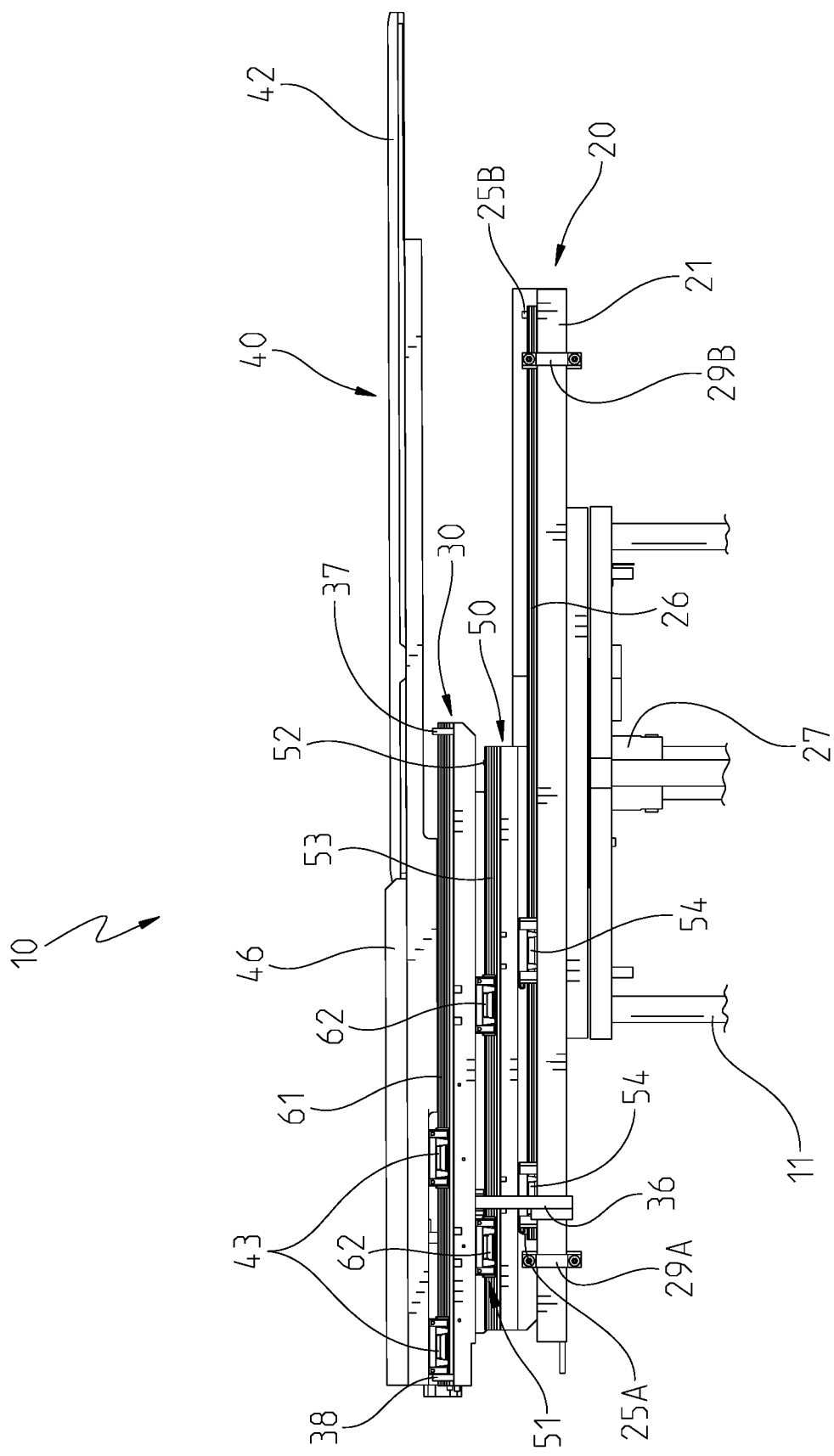
FIG. 7 is another left side elevation view of the telescoping linear extension robot of FIG. 1, shown in a retracted configuration.

As shown in FIG. 6, while telescoping linear extension robot 10 is in the fully extended configuration, retraction pin 52 is spaced apart from the rear carriage 62 of second platform 30. As telescoping linear extension robot 10 is retracted, the distance between retention pin 52 and the adjacent rear carriage 62 closes, until the adjacent rear carriage 62 of second platform 30 eventually impacts the pin 52. This impact occurs at a point in the retraction of second platform 30 in which second platform 30 is still being driven to retract by motor 22. Second platform 30 continues to extend towards the retracted configuration, and "drags" intermediate platform 50 rearward by retention pin 52. This retraction process is complete when second platform 30 reaches is fully retracted position, as shown in FIGS. 5, 7, and 9.

During translation on telescoping linear extension robot 10, the contact point between either extension pin 51 or retention pin 52 increases the moving inertia by the ratio of the intermediate platform 50 mass to the entire moving mass (which includes the mass of the intermediate platform 50 mass, second platform 30 mass, and third platform 40 mass). In the present embodiment, this inertial increase is less than 10%. Because of this minor increase in moving inertia, there is no material impact on the dynamic performance of motor 22, and no impact at all on motor 32, assuming the velocities employed are small relative to the overall moving mass.

In this way, motor 22 drives both the second platform 30 and intermediate platform 50 forward and back during translation of telescoping linear extension robot 10, but motor 22 is only directly mechanically coupled to second platform 30 while remaining decoupled from floating intermediate platform 50. That is, floating intermediate platform 50 is free to move (i.e., "float") through its linear path without any direct influence of motor 22. Instead, motor 22 only "indirectly" influences the movement of platform 50 through the interaction between pins 51 and 52 and intermediate platform 50 as described herein.

Therefore, the configuration of intermediate platform 50 second platform 30 are configured to cooperate to effectively travel a distance in excess of the length of rails 26, which would otherwise be the limiting factor in extension capabilities in the absence of the "floating" intermediate platform 50. In the illustrative embodiment of FIG. 6, the additional extension length D achieved was nearly 165 mm without any adverse impact in the rigidity and support provided by substrate base 42. In alternative embodiment, this added extension length can be scaled up or down by design choices made for any given application.

The move profiles programmed into the controller for the first and second extension servo axes of motors 22 and 32 are generally sequential, rather than simultaneous, to minimize loop interaction. However, the controller may be programmed for synchronized moves between motor 22 and motor 32, with due consideration for the stiffness of the axes of motor 22 and motor 32 and the drive forces available.

This methodology provides smaller deflection under load and at extension, as compared to a design supporting only two driven platforms without an intermediate "floating" platform. The deflection requirement is met in a much more compact rotational-axis configuration than could otherwise be achieved. In one exemplary embodiment, the rotation diameter is reduced by nearly 330 mm allowing this transfer robot to support up to 3 process chambers within a limited floor footprint. In particular, a reduction in length of the fixed platform 20 is made possible by the inclusion of intermediate platform 50 for a given extension capability, but without the inclusion of another motor or a direct mechanical linkage between motor 22 and intermediate platform 50.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

ASPECTS

Aspect 1 is a telescoping linear extension robot including a base platform, a first driven platform, an intermediate platform disposed and deployed between the base platform and the first driven platform, and a first motor operably coupled to the first driven platform and the base platform. The intermediate platform is slideably coupled to the base platform and configured to move along a first path relative to the base platform, and the first driven platform is slideably coupled to the intermediate platform and configured to move along a second path relative to the intermediate platform, the first path defining an extension of the second path. Activation of the first motor drives the first driven platform along the second path, and the first motor is decoupled from the intermediate platform such that the intermediate platform is allowed to move independently of the first motor along the first path. The intermediate platform is configured to non-drivingly increase an extendable range of the telescoping linear extension robot.

Aspect 2 is the telescoping linear extension robot of Aspect 1, wherein the first path is a first linear path, and the second path is a second linear path substantially parallel to the first linear path.

Aspect 3 is the telescoping linear extension robot of Aspects 1 or 2, further including a second driven platform, slideably coupled to the first driven platform and configured to move along a third linear path substantially parallel to the first and second linear paths, and a second motor operably coupled to the first driven platform and the second driven platform, such that activation of the second motor drives the second driven platform along the third linear path.

Aspect 4 is the telescoping linear extension robot of any of Aspects 1-3, further comprising a housing at least partially enclosing the telescoping linear extension robot.

Aspect 5 is the telescoping linear extension robot of Aspect 4, wherein the housing further includes at least one slot, the second driven platform configured to be extendable through the at least one slot.

Aspect 6 is the telescoping linear extension robot of Aspect 5, wherein the telescoping linear extension robot is rotatably mounted within the housing such that the second driven platform can be positioned to be extend through a plurality of slots.

Aspect 7 is the telescoping linear extension robot of any of Aspects 1-3, wherein the first driven platform is part of a first driven platform assembly further including a lower motor slider, an upper motor track fixed to an upper surface of the first driven platform, an upper rail fixed to the upper surface, and an intermediate carriage fixed to a lower surface of the first driven platform.

Aspect 8 is the telescoping linear extension robot of Aspect 7, wherein the second driven platform is part of a second driven platform assembly further including an upper motor slider positioned to be driven by the upper motor track, and an upper carriage fixed to a lower surface of the second driven platform, and configured to be slidingly retained onto the upper rail.

Aspect 9 is the telescoping linear extension robot of Aspect 8, wherein the intermediate platform is part of an intermediate platform assembly further including an intermediate rail fixed to a top surface of the intermediate platform, the intermediate rail configured to be slidingly retained by the intermediate carriage of the first driven platform assembly, a lower carriage fixed to a bottom surface of the intermediate platform, a retraction pin extending up from a rear portion of the intermediate platform, and an extension pin extending up from a front portion of the intermediate platform.

Aspect 10 is the telescoping linear extension robot of Aspect 9, wherein the base platform is part of a base platform assembly further including a lower rail fixed to a top surface of the base platform, the lower rail configured to be slidingly retained by the lower carriage of the intermediate platform assembly, and a lower motor track positioned to drivingly receive the lower motor slider of the first driven platform assembly.

Aspect 11 is the telescoping linear extension robot of Aspect 9, wherein the extension pin is positioned to be contacted by a portion of the first driven platform assembly as the first driven platform is moved from a retracted position toward an extended position, and to drag the intermediate platform toward its extended position by the contact with the extension pin.

Aspect 12 is the telescoping linear extension robot of Aspect 9, wherein the retraction pin is positioned to be contacted by a portion of the first driven platform assembly as the first driven platform is moved from its extended position toward its retracted position, and to drag the intermediate platform toward its retracted position by the contact with the retraction pin.

Aspect 13 is the telescoping linear extension robot of any of Aspects 1-3, wherein the first motor is a first linear magnet motor disposed along respective edges of the first driven platform and the base platform, and the second motor is a second linear magnet motor disposed between of the first driven platform and the second driven platform.

Aspect 14 is the telescoping linear extension robot of any of Aspects 1-3, wherein the second driven platform further comprises a substrate base sized and shaped to support and transport substrates for use in semiconductor processing.

Aspect 15 is the telescoping linear extension robot of any of Aspects 1-14, wherein the base platform is part of a base assembly further including a lower platform, an upper platform rotatably supported atop the lower platform, the upper platform fixed to the base platform, a stand which supports the lower platform spaced above a ground surface, and a drive shaft extending upwardly along the stand and through the lower platform, the drive shaft configured to rotate, raise and/or lower the upper platform and the base platform.

Aspect 16 is the telescoping linear extension robot of any of Aspects 1-15, further including a first encoder disposed and deployed between the base platform and the first driven platform, the first encoder configured to issue a signal indicative of a linear position of the first driven platform relative to the base platform, and a second encoder disposed and deployed between the first driven platform and second driven platform, the second encoder configured to issue a signal indicative of a linear position of the second driven platform relative to the first driven platform.

Aspect 17 is a method of delivering a substrate for use in semiconductor processing using a telescoping linear extension robot, the method including placing substrate on a substrate base of the telescoping linear extension robot, extending a first driven platform a first distance via a direct coupling with a first motor, extending the first driven platform a second distance beyond the first distance by actuating an intermediate platform via an indirect coupling with the first motor, and extending a second driven platform a third distance beyond the second distance via a direct coupling with a second motor, the second driven platform including the substrate base.

Aspect 18 is the method of Aspect 17, wherein the step of extending the first driven platform the second distance further includes impacting a first portion of the intermediate platform with a first portion of the first driven platform as the first driven platform moves reaches the end of the first distance along its extension path.

Aspect 19 is the method of Aspects 17 or 18, further including retracting the first driven platform the second distance by direct coupling between the first driven platform and the first motor, and retracting the first driven platform the first distance by actuating the intermediate platform via the indirect coupling with the first motor.

Aspect 20 is the method of Aspect 19, wherein the step of retracting the first driven platform the first distance further includes impacting a second portion of the intermediate platform with a second portion of the first driven platform as the first driven platform reaches the end of the second distance along its retraction path, the first portion of the intermediate platform spaced from the second portion of the intermediate platform, and the first portion of the first driven platform spaced from the second portion of the first driven platform.

What is claimed is:

1. A telescoping linear extension robot comprising:
   a base platform;
   a first driven platform;
   an intermediate platform deployed between the base platform and the first driven platform, wherein:
     the intermediate platform is slideably coupled to the base platform and configured to move along a first path relative to the base platform; and
     the first driven platform is slideably coupled to the intermediate platform and configured to move along a second path relative to the intermediate platform, the first path defining an extension of the second path;
   a first motor operably coupled to the first driven platform and the base platform, such that activation of the first motor drives the first driven platform along the second path, the first motor decoupled from the intermediate platform such that the intermediate platform is allowed to move independently of the first motor along the first path and float while the first driven platform moves along the second path, whereby the intermediate platform is configured to non-drivingly increase an extendable range of the telescoping linear extension robot; and
   a second driven platform, slideably coupled to the first driven platform and configured to move along a third linear path substantially parallel to the first and second linear paths; and
   a second motor operably coupled to the first driven platform and the second driven platform, such that activation of the second motor drives the second driven platform along the third linear path.

2. The telescoping linear extension robot of claim 1, wherein the first path is a first linear path, and the second path is a second linear path substantially parallel to the first linear path.

3. The telescoping linear extension robot of claim 1, wherein the base platform is part of a base assembly further comprising:
   a lower platform;
   an upper platform rotatably supported atop the lower platform, the upper platform fixed to the base platform;
   a stand which supports the lower platform spaced above a ground surface; and
   a drive shaft extending upwardly along the stand and through the lower platform, the drive shaft configured to rotate, raise, and/or lower the upper platform and the base platform.

4. The telescoping linear extension robot of claim 1, further comprising a housing at least partially enclosing the telescoping linear extension robot.

5. The telescoping linear extension robot of claim 4, wherein the housing further includes at least one slot, the second driven platform configured to be extendable through the at least one slot.

6. The telescoping linear extension robot of claim 5, wherein the telescoping linear extension robot is rotatably mounted within the housing such that the second driven platform can be positioned to be extended through a plurality of slots.

7. The telescoping linear extension robot of claim 1, wherein the first driven platform is part of a first driven platform assembly further comprising:

a lower motor slider;

an upper motor track fixed to an upper surface of the first driven platform;

an upper rail fixed to the upper surface; and an intermediate carriage fixed to a lower surface of the first driven platform.

8. The telescoping linear extension robot of claim 7, wherein the second driven platform is part of a second driven platform assembly further comprising:

an upper motor slider positioned to be driven by the upper motor track; and an upper carriage fixed to a lower surface of the second driven platform, and configured to be slidingly retained onto the upper rail.

9. The telescoping linear extension robot of claim 8, wherein the intermediate platform is part of an intermediate platform assembly further comprising:

an intermediate rail fixed to a top surface of the intermediate platform, the intermediate rail configured to be slidingly retained by the intermediate carriage of the first driven platform assembly;

a lower carriage fixed to a bottom surface of the intermediate platform;

a retraction pin extending up from a rear portion of the intermediate platform; and an extension pin extending up from a front portion of the intermediate platform.

10. The telescoping linear extension robot of claim 9, wherein the base platform is part of a base platform assembly further comprising:

a lower rail fixed to a top surface of the base platform, the lower rail configured to be slidingly retained by the lower carriage of the intermediate platform assembly; and a lower motor track positioned to drivingly receive the lower motor slider of the first driven platform assembly.

11. The telescoping linear extension robot of claim 9, wherein the extension pin is positioned to be contacted by a portion of the first driven platform assembly as the first driven platform is moved from a retracted position toward an extended position, and to drag the intermediate platform toward its extended position by the contact with the extension pin.

12. The telescoping linear extension robot of claim 9, wherein the retraction pin is positioned to be contacted by a portion of the first driven platform assembly as the first driven platform is moved from its extended position toward its retracted position, and to drag the intermediate platform toward its retracted position by the contact with the retraction pin.

13. The telescoping linear extension robot of claim 1, wherein:

the first motor is a first linear magnet motor disposed along respective edges of the first driven platform and the base platform; and the second motor is a second linear magnet motor disposed between of the first driven platform and the second driven platform.

14. The telescoping linear extension robot of claim 1, wherein the second driven platform further comprises a substrate base sized and shaped to support and transport substrates for use in semiconductor processing.

15. The telescoping linear extension robot of claim 1, further comprising:

a first encoder deployed between the base platform and the first driven platform, the first encoder configured to issue a signal indicative of a linear position of the first driven platform relative to the base platform; and a second encoder deployed between the first driven platform and the second driven platform, the second encoder configured to issue a signal indicative of a linear position of the second driven platform relative to the first driven platform.

16. A method of delivering a substrate for use in semiconductor processing using a telescoping linear extension robot, the method comprising:

placing substrate on a substrate base of the telescoping linear extension robot;

extending a first driven platform a first distance via a direct coupling with a first motor;

extending the first driven platform a second distance beyond the first distance by actuating an intermediate platform via an indirect coupling with the first motor; and extending a second driven platform a third distance beyond the second distance via a direct coupling with a second motor, the second driven platform including the substrate base.

17. The method of claim 16, wherein the step of extending the first driven platform the second distance further includes impacting a first portion of the intermediate platform with a first portion of the first driven platform as the first driven platform moves reaches the end of the first distance along its extension path.

18. The method of claim 17, further comprising:

retracting the first driven platform the second distance by direct coupling between the first driven platform and the first motor; and retracting the first driven platform the first distance by actuating the intermediate platform via the indirect coupling with the first motor.

19. The method of claim 18, wherein the step of retracting the first driven platform the first distance further includes coupling a second portion of the intermediate platform with a second portion of the first driven platform as the first driven platform reaches the end of the second distance along its retraction path, the first portion of the intermediate platform spaced from the second portion of the intermediate platform, and the first portion of the first driven platform spaced from the second portion of the first driven platform.

\* \* \* \* \*